United States Patent
Rao et al.

(10) Patent No.: US 9,477,386 B2
(45) Date of Patent: Oct. 25, 2016

(54) SYSTEMS AND METHODS FOR HIGH THROUGHPUT SIGNAL PROCESSING USING INTERLEAVED DATA CONVERTERS

(71) Applicant: NATIONAL INSTRUMENTS CORPORATION, Austin, TX (US)

(72) Inventors: Yong Rao, Austin, TX (US); Ahsan Aziz, Austin, TX (US); James W. McCoy, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 303 days.

(21) Appl. No.: 14/257,944

(22) Filed: Apr. 21, 2014

(65) Prior Publication Data

US 2015/0303936 A1    Oct. 22, 2015

(51) Int. Cl.
| | |
|---|---|
| *H03M 1/00* | (2006.01) |
| *G06F 3/0484* | (2013.01) |
| *H03K 19/177* | (2006.01) |
| *H03K 19/173* | (2006.01) |
| *G06F 3/0481* | (2013.01) |
| *H03M 1/12* | (2006.01) |

(52) U.S. Cl.
CPC ....... *G06F 3/04842* (2013.01); *G06F 3/04817* (2013.01); *H03K 19/1733* (2013.01); *H03K 19/17748* (2013.01); *H03M 1/1215* (2013.01)

(58) Field of Classification Search
CPC ............. H03M 1/121; H03M 1/1245; H03M 1/1215; G06F 3/04817; G06F 3/04842; H03K 19/1733; H03K 19/17748
USPC .......................................... 341/155, 123, 141
See application file for complete search history.

(56) References Cited

U.S. PATENT DOCUMENTS

| | | | |
|---|---|---|---|
| 6,496,550 B1 | 12/2002 | Bruccoleri | |
| 8,698,659 B2* | 4/2014 | Hovakimyan | H03M 1/0626 341/118 |
| 8,781,326 B2* | 7/2014 | Hu | H04B 10/548 398/140 |
| 9,231,608 B1* | 1/2016 | Pupalaikis | H03M 1/1028 |
| 9,281,834 B1* | 3/2016 | Waltari | H03M 1/1023 |
| 9,287,889 B2* | 3/2016 | Chiu | H03M 1/1009 |
| 2014/0152477 A1 | 6/2014 | Lewis | |

* cited by examiner

*Primary Examiner* — Brian Young
(74) *Attorney, Agent, or Firm* — Meyertons Hood Kivlin Kowert & Goetzel, P.C.; Jeffrey C. Hood; Matthew C. Washburn

(57) ABSTRACT

Various embodiments of methods and associated devices for increasing throughput in a programmable hardware element using interleaved data converters are disclosed. A device comprising a programmable hardware element may be configured to comprise a plurality N of processing portions. The device may receive an input signal, and sample the signal in an interleaved fashion, on a per sample basis, at an effective rate K, to produce N parallel data streams. The N parallel data streams may be processed in parallel by the plurality N of processing portions. Outputs of the plurality N of processing portions may be combined to produce output data. The effective rate K and/or the number N of parallel data streams may be specified by user input. Alternatively, these values may be determined automatically. For example, the effective rate K may be determined automatically based on a bandwidth of the input signal.

19 Claims, 8 Drawing Sheets

SYSTEMS AND METHODS FOR HIGH THROUGHPUT SIGNAL PROCESSING USING INTERLEAVED DATA CONVERTERS

FIELD OF THE INVENTION

The present invention relates to the field of signal processing, and more particularly to systems and methods for increasing throughput in a programmable hardware element using interleaved data converters.

DESCRIPTION OF THE RELATED ART

Programmable hardware elements, such as field-programmable gate arrays (FPGAs), are increasingly being used in digital signal processing systems. In some modern signal processing systems, sample rates at input/output devices, such as analog-to-digital converters (ADCs) and digital-to-analog converters (DACs), are higher than the maximum clock rate of the programmable hardware elements. For example, some ADCs produce parallel data streams of time-interleaved samples. Although such time interleaved data converters produce parallel data streams, serial data processing remains the de facto method in the industry today. Specifically, while a few very custom applications of parallel processing schemes have been developed, mainly addressing methods for improving time domain interleaved data converter performance, they do not address a generalization to common signal processing blocks such as FIR, FFT, Correlation, etc. Additionally, there are no commercial software tools that take full advantage of the parallel streams from time interleaved data converters. As wireless bandwidths continue to widen, outstripping the capability of the programmable hardware elements to process in real-time, efficient processing of data in programmable hardware elements is becoming very critical.

Thus, there exists a need for methods and tools for facilitating parallel digital signal processing in programmable hardware elements.

SUMMARY

Systems and methods are presented for increasing throughput in a programmable hardware element using interleaved data converters. Specifically, the methods presented enable processing of multiple parallel samples coming from the I/O (interleaved in time) to produce multiple output samples (interleaved in time) in parallel at any given time. This can provide an effective throughput at the I/O rates that can be higher than a maximum clock rate of the programmable hardware element.

A method for processing a signal is presented. A device comprising a programmable hardware element may be configured to comprise a plurality N of processing portions. The device may receive an input signal, and sample the signal in an interleaved fashion, on a per sample basis, at an effective rate K, to produce N parallel data streams. The N parallel data streams may be processed in parallel by the plurality N of processing portions. Outputs of the plurality N of processing portions may be combined to produce output data.

The effective rate K and/or the number N of parallel data streams may be specified by user input. A desired clock rate C may also be specified by user input. Alternatively, these values may be determined automatically. For example, the effective rate K may be determined automatically based on a bandwidth of the input signal.

A device comprising an analog to digital converter (ADC) and a programmable hardware element is disclosed. The device may be configured to perform embodiments of the method described above.

A method for configuring a device that includes a programmable hardware element to process a signal is disclosed. The method for configuring the device may be performed using a graphical program development environment. A plurality of symbols may be displayed, each symbol representing a signal processing block useable to configure a programmable hardware element. For example, the signal processing blocks may be blocks (or nodes) of a graphical program. User input may be received selecting a first signal processing block. The first signal processing block may be a signal processing function that utilizes a plurality of parallel function blocks and a combiner block. Examples of possible signal processing functions that may be selected may include: a finite impulse response (FIR) filter, a FFT (fast Fourier transform), an IFFT (inverse FFT), a complex auto-correlation, a complex cross-correlation, a digital mixer, matrix inverter, matrix multiplier, and a frequency domain equalizer. Other signal processing functions are also contemplated.

A sampling rate K of an input signal, a maximum clock rate R of the programmable hardware element, a desired clock rate C of the programmable hardware element, and a number N of the parallel function blocks may be determined. These parameters may be determined automatically and/or by user input.

The first signal processing block may be instantiated on the programmable hardware element, e.g., as a portion of a graphical program instantiated on the programmable hardware element. An interleaved ADC of the device may also be configured to sample the input signal in an interleaved fashion on a per sample basis at sampling rate K, to produce N parallel outputs. The N parallel outputs may be connected to respective inputs of the N parallel function blocks, such that the input signal may be processed by the N parallel function blocks.

BRIEF DESCRIPTION OF THE DRAWINGS

A better understanding of the present inventions can be obtained when the following detailed description is considered in conjunction with the following drawings, in which.

Figure 1:
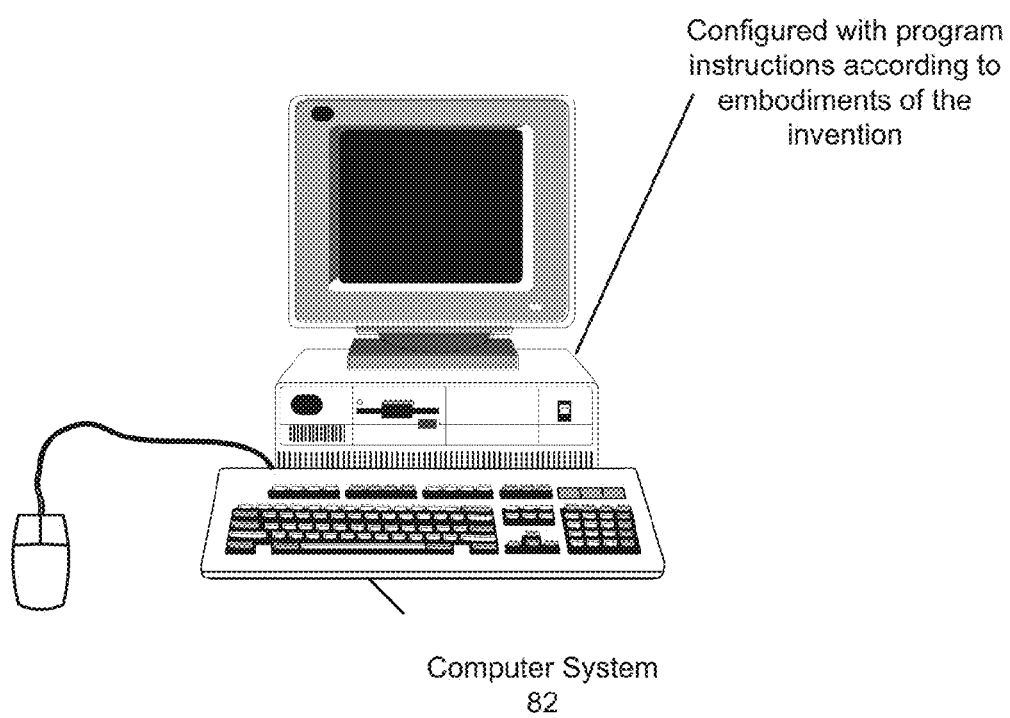
FIG. 1 illustrates a computer system configured to execute a graphical program to configure a programmable hardware element according to an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

TERMINOLOGY

The following is a glossary of terms used in the present application:

Memory Medium—Any of various types of memory devices or storage devices. The term "memory medium" is intended to include an installation medium, e.g., a CD-ROM, floppy disks 105, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DIADem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Said another way, data flow programs execute according to a data flow model of computation under which program functions are scheduled for execution in response to their necessary input data becoming available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Embodiments of the present invention may be realized in any of various forms. For example, some embodiments may be realized as a computer-implemented method, a computer-readable memory medium, or a computer system. Other embodiments may be realized using one or more custom-designed hardware devices such as ASICs. Other embodiments may be realized using one or more programmable hardware elements such as FPGAs.

In some embodiments, a computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a hand-held device, a tablet computer, a wearable computer, etc.

FIG. 1—Computer System

FIG. 1 illustrates a computer system 82 configured to execute a graphical program to configure a programmable hardware element. One embodiment of a method for configuring a programmable hardware element is described below.

As shown in FIG. 1, the computer system 82 may include a display device configured to display the graphical program as the graphical program is created and/or executed. The display device may also be configured to display a graphical user interface or front panel of the graphical program during execution of the graphical program. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store a graphical program development environment and/or one or more graphical programs which are executable to perform the methods described herein. In some embodiments, the graphical program development environment may comprise National Instruments LabVIEW™ software, and/or, LabVIEW™ FPGA. The graphical programming development environment application used to create and/or execute graphical programs which may then be configured on to a programmable hardware element. The memory medium may also store operating system software, as well as other software for operation of the computer system. Various embodiments further include receiving or storing instructions and/or data implemented in accordance with the foregoing description upon a carrier medium.

Figure 2:
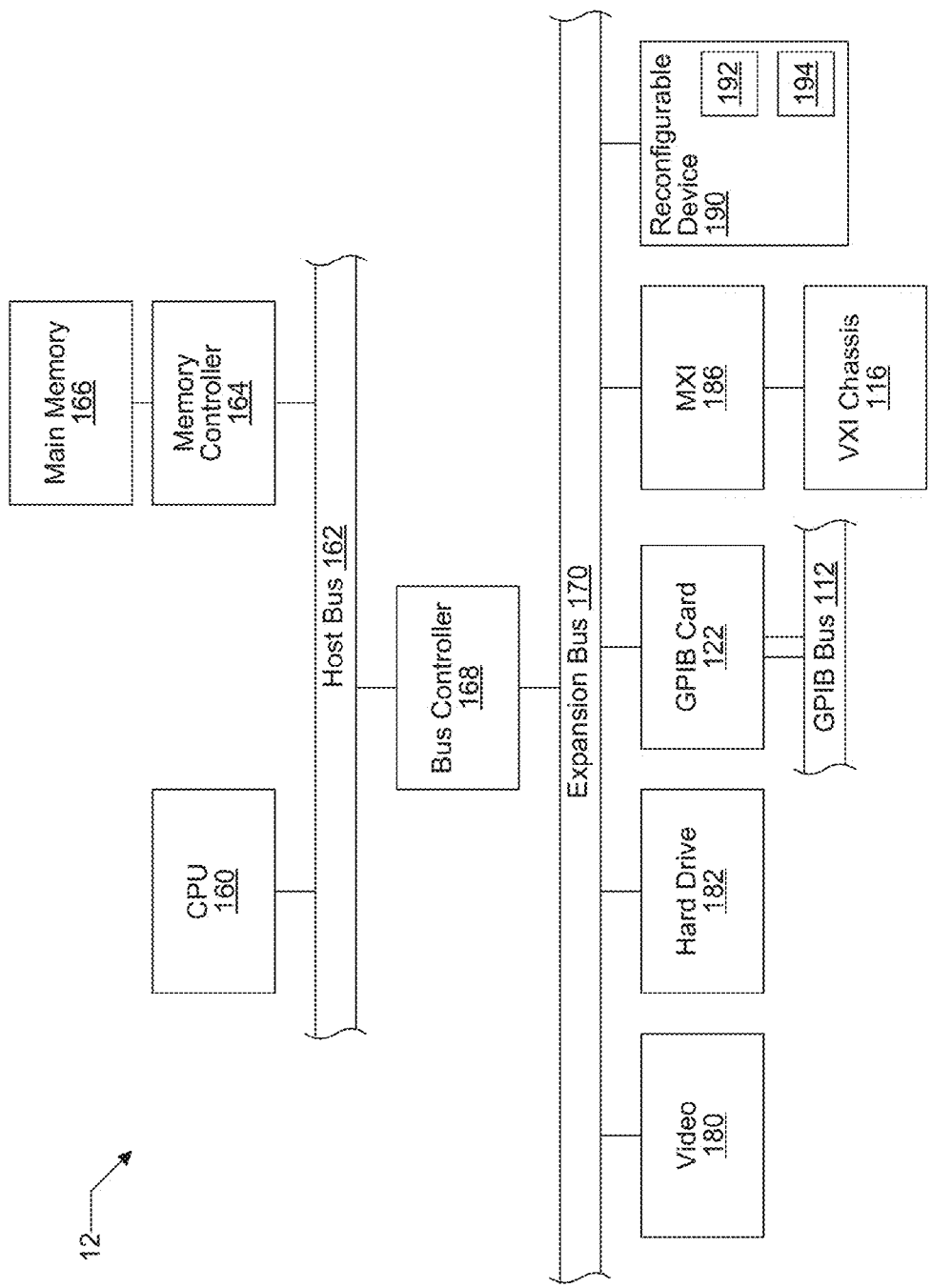
FIG. 2 is an exemplary block diagram of the computer systems of FIG. 1.

FIG. 2—Computer System Block Diagram

FIG. 2 is a block diagram 12 representing one embodiment of the computer system 82 illustrated in FIG. 1. It is noted that any type of computer system configuration or architecture can be used as desired, and FIG. 2 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store the graphical program to configure a programmable hardware element. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices. The computer 82 further comprises a video display subsystem 180 and hard drive 182 coupled to the expansion bus 170. The computer 82 may also comprise a GPIB (general purpose interface bus) card 122 coupled to a GPIB bus 112, and/or an MXI (Multisystem eXtension Interface) device 186 coupled to a VXI (VMEbus eXtensions for Instrumentation) chassis 116.

As shown, a device 190 may also be connected to the computer. The computer system may be configured to deploy a graphical program to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program.

The device 190 may include a processor and memory which may execute a real time operating system. The device 190 may also or instead comprise a programmable hardware element 192. The device 190 may also or instead comprise one or more signal converting elements 194. The one or more signal converting elements may comprise, e.g., an analog-to-digital converter (ADC) and/or a digital-to-analog converter (DAC). Thus, the reconfigurable device 190 may be configured, e.g., by a graphical program deployed by the computer system, to receive an analog signal, convert the analog signal to a digital signal using an ADC, and process the digital signal using the processor and/or the programmable hardware element 192. Alternatively, or additionally, the reconfigurable device 190 may be configured to process a digital signal using the processor and/or the programmable hardware element 192, convert the digital signal to an analog signal using a DAC, and output the analog signal.

Figure 3:
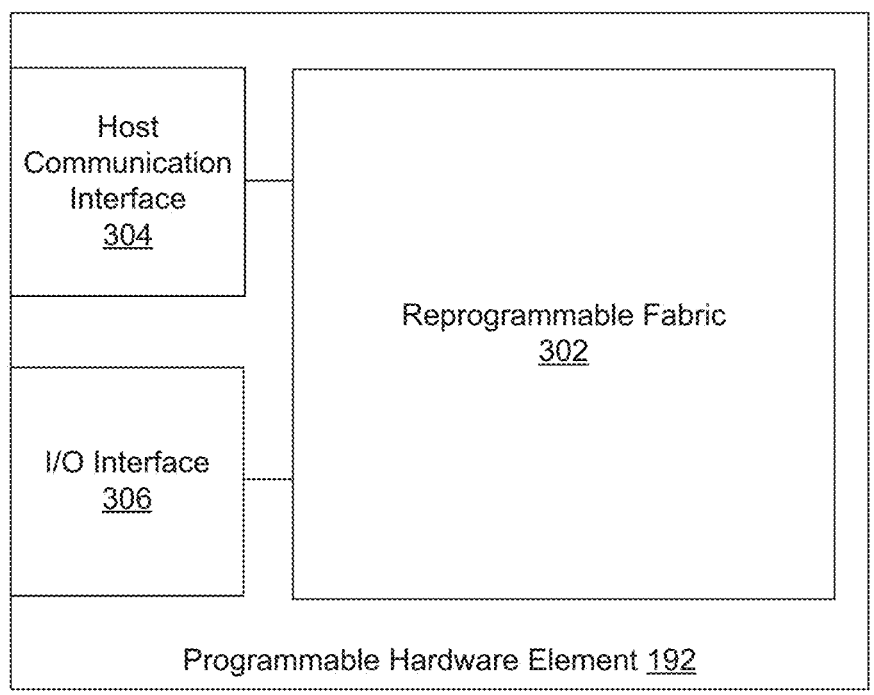
FIG. 3 is an exemplary block diagram of a programmable hardware element.

FIG. 3—Programmable Hardware Element

FIG. 3 is a high-level block diagram illustrating a programmable hardware element 192 illustrated in FIG. 2, according to one embodiment. It is noted that any type of programmable hardware element may be used, and FIG. 3 merely illustrates a representative embodiment. Elements of a programmable hardware element not necessary to understand the present description have been omitted for simplicity. The programmable hardware element 192 shown may be suitable for use in some embodiments of the present invention.

The programmable hardware element 192 may include one or more of various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores).

The programmable hardware element 192, as is well known to those of skill in the art of programmable hardware elements such as FPGAs, includes a reprogrammable fabric 302, e.g., logic gates, via which specified functionality may be implemented in hardware. The programmable hardware element may be suitable for deployment of a graphical program configured for parallel processing of digital signals, as will be described below in detail.

Figure 5:
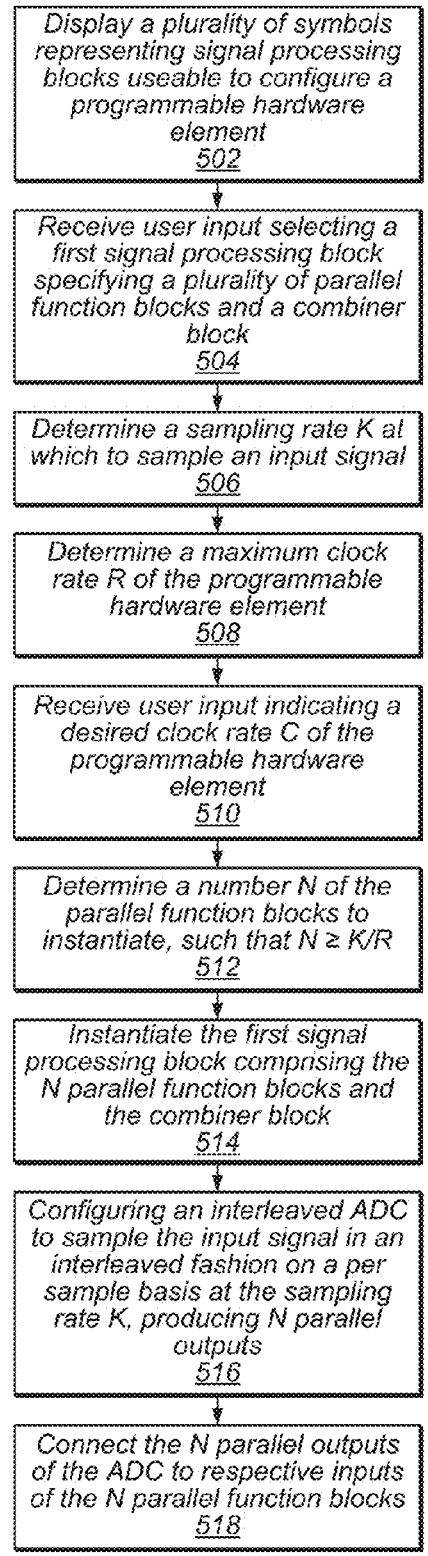
FIG. 5 is a flowchart diagram illustrating an exemplary method for configuring a programmable hardware element to perform parallel processing of a digital signal.

As FIG. 5 indicates, in some embodiments, the programmable hardware element 192 may also include a host communication interface 304, coupled to the fabric 302. The host communication interface 304 may be operable to facilitate communications between the programmable hardware element and an external host computer, e.g., computer 82. While the host communication interface 304 is shown implemented in the programmable hardware element, it should be noted that in other embodiments, the host communication interface 304 may be external to the programmable hardware element 192.

As Figure also 5 indicates, in some embodiments, the programmable hardware element 192 may also include an input/output (I/O) interface 306, coupled to the fabric 302. The I/O interface 306 may be operable to facilitate communications between the programmable hardware element and external signal processing components, such as analog-to-digital converters (ADCs), digital-to-analog converters (DACs), sensors, display devices, processing elements such as additional programmable hardware elements, etc. The I/O interface 306 may be capable of inputting and/or outputting serial signals, parallel multi-bit signals, and/or arrays of multi-bit signals. While the host communication interface 304 is shown implemented in the programmable hardware element, it should be noted that in other embodiments, the host communication interface 304 may be external to the programmable hardware element 192.

Figure 4:
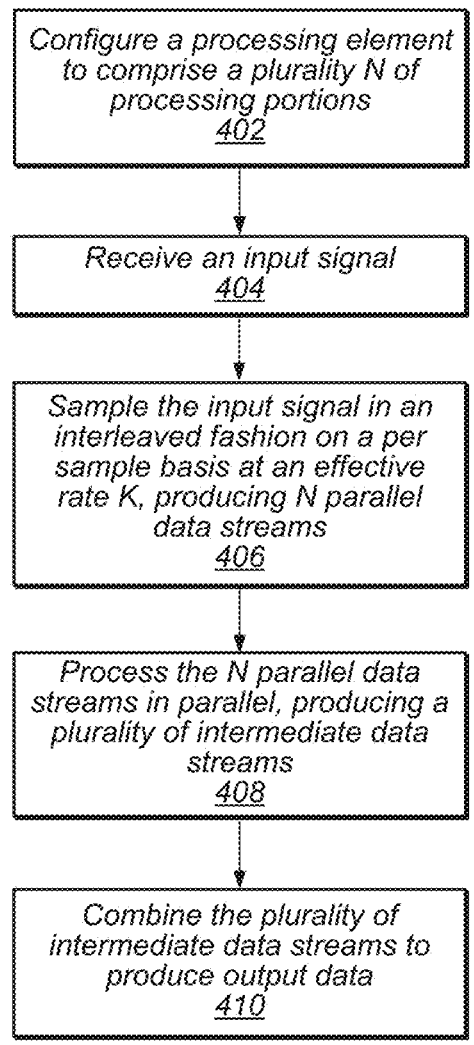
FIG. 4 is a flowchart diagram illustrating an exemplary method for performing parallel processing of a digital signal.
Figure 8:
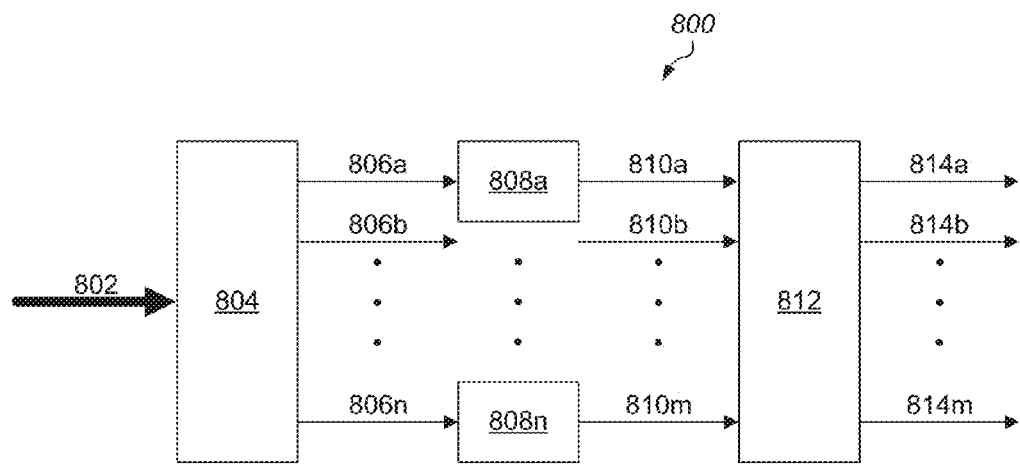
FIG. 8 is a conceptual signal flow diagram of receiving and processing a signal.

It should be noted that the programmable hardware elements of FIG. 3 are meant to be exemplary only, and are not intended to limit the programmable hardware elements to any particular configurations. For example, in some embodiments, discussed elsewhere herein, the programmable hardware element(s) may be coupled to, or implement, additional functional components, such as, for example, counters, timers, accelerators, and so forth, that may be useable by the illustrated portions of the programmable hardware element.
FIG. 4—Parallel Processing of a Digital Signal FIG. 4 is a flowchart diagram illustrating a method for performing parallel processing of a digital signal. The method shown in FIG. 4 may be used in conjunction with any of the systems or devices shown in the above Figures, among other devices. In particular, the method may be performed by a device, such as the reconfigurable device 190 illustrated in FIG. 2, comprising a programmable hardware element, such as the programmable hardware element 192 illustrated in FIGS. 2-3. In various embodiments, some of the method elements shown may be performed concurrently, in a different order than shown, or may be omitted. Note also that additional method elements may also be performed as desired. FIG. 8 is a conceptual signal flow diagram of receiving and processing a signal, which may be used in conjunction with the method of FIG. 4. The method may be performed as follows.

As shown, in 402, a programmable hardware element of a device, such as the programmable hardware element 192 of reconfigurable device 190, may be configured to comprise a plurality N of processing portions, such as the processing portions 808*a-n* of FIG. 8. For example, each of the N processing portions 808*a-n* may comprise a group of contiguous or noncontiguous configurable logic gates. Each processing portion of the programmable hardware element may be configured to process data up to a maximum rate R. For example, R may be the maximum clock rate of the programmable hardware element. In some embodiments, the maximum rate R may be provided by user input. In other embodiments, the maximum rate R may be automatically determined, e.g., by querying the programmable hardware element or by consulting a list of maximum rates for various types or models of programmable hardware elements.

In 404, the device may receive an input signal, such as the input signal 802. For example, the input signal may be a communication signal according to any of various wireless communication standards, such as those propagated by 3GPP or 3GPP2.

In 406, an ADC of the device, such as the ADC 804, may sample the input signal at an effective rate K. The ADC may be a time-interleaved ADC, comprising a plurality of parallel ADCs, as known in the art. Thus, the sampling may be performed in an interleaved fashion, on a per sample basis, so as to produce a plurality N of parallel data streams, such as the data streams 806*a-n*. For example, a first data stream may carry a sample taken at a first time, a second data stream may carry a next sequential sample taken at a second time, and so on for the first N samples. The first data stream may then also carry sample N+1. Thus, each data stream may receive new data at a rate of K/N.

The effective rate K of the sampling may be greater than the maximum rate R of the processing portions of the programmable hardware element. However, K and N should be defined such that K/N≤R, so that the data streams having data rate K/N may be processed by the processing portions of the programmable hardware element having maximum rate R. In some embodiments, the effective rate K may be specified by user input. In other embodiments, the effective rate K may be automatically determined or constrained based on the capabilities of the ADC or other hardware of the device. In other embodiments, K may be determined based on a bandwidth of the input signal. For example, an ADC may require a minimum sampling rate to effectively sample an input signal having a given bandwidth, where the minimum sampling rate may depend upon the type of ADC (e.g., Nyquist ADC or delta-sigma ADC). In yet other embodiments, K may be automatically determined based on N and R, so as to preserve the relationship defined above.

Similarly, in some embodiments, the number of processing portions N may be specified by user input. In other embodiments, N may be determined based on K and R, so as to preserve the relationship defined above. N may be constrained based on resources available in the programmable hardware element.

In some embodiments, a desired clock rate C of the processing portions of the programmable hardware element may be specified by user input and/or system constraints, where C≤R. For example, a user may wish to clock the programmable hardware element at a rate lower than the maximum clock rate R, e.g., to ease routing constraints. Where C<R, K and N should be further defined such that K/N≤C, so that the data streams having data rate K/N may be processed by the processing portions of the programmable hardware element having desired clock rate C.

In 408-410, parallel signal processing may be performed. In 408, each of the N processing portions 808a-n of the programmable hardware element may process a respective one of the N parallel data streams 806a-n from the ADC. The processing may be performed in parallel by the N processing portions 808a-n. Each of the N processing portions may output one or more intermediate data streams 810a-m. In some embodiments, each processing portion may output an intermediate data stream at a rate O that matches the input rate K/N. In other embodiments, one or more processing portions may each output data at a rate O that is lower than K/N, e.g., if the one or more processing portions perform decimation. In other embodiments, one or more processing portions may each output data at a rate O that is higher than K/N, e.g., if the one or more processing portions perform interpolation. In some embodiments, outputting data at a higher rate than K/N may comprise outputting multiple intermediate data streams, e.g., each having a rate K/N.

In 410, the intermediate data streams 810a-m of the N processing portions may be combined to produce output data, such as output data 814a-m, which is output by combiner block 812. This combining may comprise additional processing on combinations of the intermediate data streams of the N processing portions, so as to complete the processing function to be performed on the input signal. For example, the intermediate data streams may be cross-multiplied with each other, or other processing may be executed, according to the specific function to be performed on the input signal.

For example, in 406-410 the programmable hardware element may perform signal processing on the input signal according to a "divide and conquer" algorithm, as known in the art. According to such algorithms, a process may be divided into a plurality of discrete parallel processes. Each of the discrete parallel processes may provide a solution for a respective portion of the input data. Further processing may then be required, according to the particular algorithm to be performed, to generate the complete solution from a combination of the solutions for the respective portions of the input data. Such algorithms are well known in the art for performing functions such as FFT (Fast Fourier Transform), IFFT (Inverse FFT), FIR (Finite Impulse Response) filter, complex auto- and cross-correlation, digital mixer, frequency domain equalizer, matrix inverter, matrix multiplier, etc.

Such algorithms may be performed according to the present invention in 406-410. In 406, the input signal may be divided into N sub-signals, which may be processed as a plurality of discrete parallel processes by the N processing portions in 408. In 410, the discrete parallel processes are combined, including further processing to produce output data comprising the complete solution to the function being performed.

Figure 9:
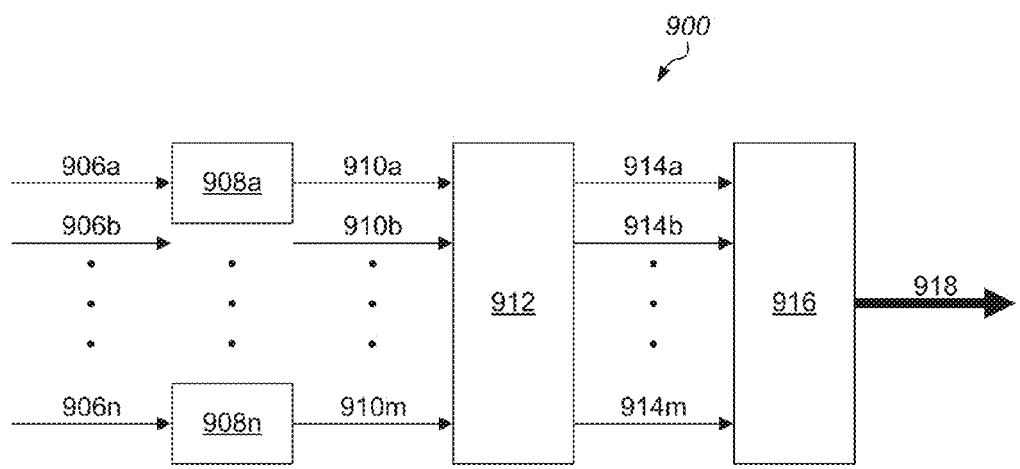
FIG. 9 is a conceptual signal flow diagram of processing and outputting a signal.

The output data may comprise serial signals, parallel multi-bit signals, and/or arrays of multi-bit signals. In some embodiments, the output data may be output as a plurality of data streams, wherein the plurality has the same number of data streams as output by the N processing portions (e.g., N data streams where each of the N processing portions produces one intermediate data stream). For example, FIG. 8 illustrates the output data as M data streams. The data streams of the output data may comprise data configured in an interleaved fashion, on a per sample basis, similar to the output of the ADC. Thus, in some embodiments, the output data may be provided to a second iteration of the present method, wherein the second iteration omits steps 404-406. In such embodiments, the output data of the first iteration may thus be provided directly to the plurality of processing portions of the second iteration, so that a second parallel processing function may be performed. An exemplary second function is illustrated in FIG. 9.

FIG. 5—Configuring a Programmable Hardware Element

FIG. 5 is a flowchart diagram illustrating a method for configuring a device comprising a programmable hardware element to perform parallel processing of a digital signal. The method shown in FIG. 5 may be used in conjunction with any of the systems or devices shown in the above Figures, among other devices. In particular, the method may be performed by a computer system, such as the computer system 82 illustrated in FIGS. 1-2, for configuring a device, such as the reconfigurable device 190 illustrated in FIG. 2, comprising a programmable hardware element, such as the programmable hardware element 192 illustrated in FIGS. 2-3. In various embodiments, some of the method elements shown may be performed concurrently, in a different order than shown, or may be omitted. Note also that additional method elements may also be performed as desired. The method may be performed as follows.

Figure 7:
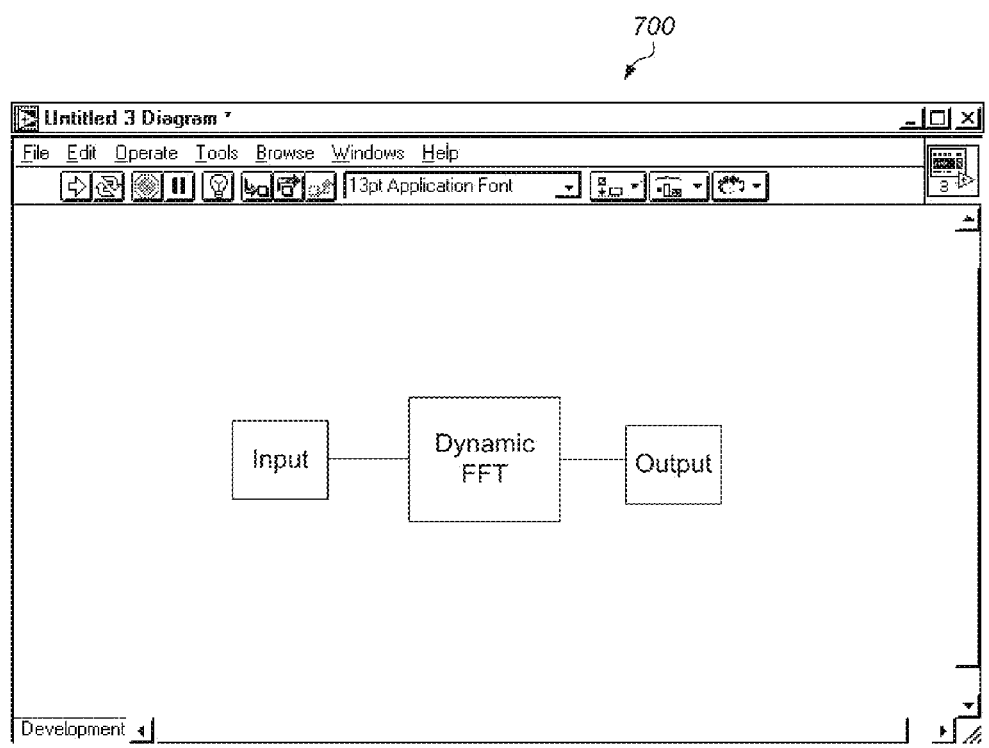
FIG. 7 illustrates an exemplary display of a block diagram illustrating a graphical program.

Configuring the programmable hardware element may be performed using a graphical program. The graphical program may be created by creating a block diagram for the graphical program. The block diagram may be created in or using any graphical programming development environment, such as LabVIEW, Simulink, VEE, or another graphical programming development environment. The block diagram may be created in response to direct user input, e.g., the user may create the block diagram by placing or "dragging and dropping" icons or nodes on the display and interconnecting the nodes in a desired fashion. Alternatively, the block diagram may be programmatically created from a program specification. The plurality of nodes in the block diagram may be interconnected to visually indicate functionality of the graphical program. The block diagram may have one or more of data flow, control flow, and/or execution flow representations. FIG. 7 illustrates an exemplary display of a block diagram illustrating a graphical program according to an embodiment of the invention.

As shown, in 502, a plurality of symbols representing signal processing blocks (or nodes) may be displayed. Each of the displayed signal processing blocks may be useable to configure the programmable hardware element. For example, each of the displayed signal processing blocks may represent a node that may be added to a graphical program for performing a signal processing function within the graphical program.

Figure 6:
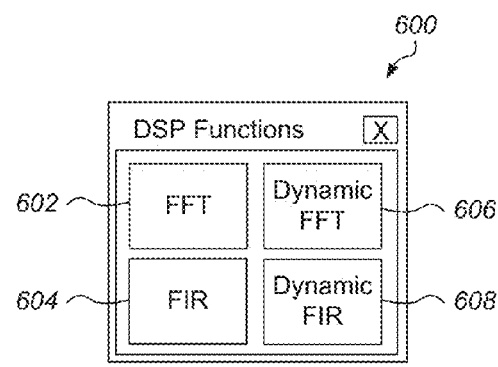
FIG. 6 illustrates an exemplary display of a plurality of symbols representing signal processing blocks.

FIG. 6 illustrates an exemplary display 600 of a plurality of symbols 602-608 representing signal processing blocks. As shown, the display 600 comprises a graphical window displaying symbols 602-608 representing four signal processing blocks. The symbol 602 may represent a FFT block that may be added to a graphical program. Similarly, the symbol 604 may represent a FIR filter block that may be added to a graphical program. The symbol 606 may represent a dynamic FFT block that may be added to a graphical program, wherein the dynamic FFT block may comprise a dynamic plurality of parallel processing portions for executing a FFT function, as discussed below. The symbol 608 may similarly represent a dynamic FIR block that may be added to a graphical program, wherein the dynamic FIR block may comprise a dynamic plurality of parallel processing portions for executing a FIR filter function, as discussed below. These functions are merely exemplary, and are not intended to be limiting. The symbols displayed may represent signal processing blocks for performing any signal processing functions known in the art.

In 504, user input may be received, selecting a first signal processing block. The first signal processing block may specify a plurality of parallel function blocks and a combiner block. For example, selecting the first signal processing block may add to a graphical program a plurality of parallel function blocks and a combiner block. Preferably, selecting the first signal processing block may add to a graphical program a single function block representing a plurality of parallel function blocks and a combiner block. In some embodiments the number of parallel function blocks represented by the single function block may remain undefined at this point in the method. The parallel function blocks and the combiner block may be configured to perform a "divide and conquer" algorithm, as discussed above in connection with FIG. 4.

For example, if the user input selects a signal processing block associated with symbol 606, a dynamic FFT block may be added to a graphical program. The dynamic FFT block may represent a plurality of parallel function blocks for performing a first stage of a parallel FFT function, and a combiner block for performing a second, combining stage of a parallel FFT function. For example, the parallel FFT function may comprise a "divide and conquer" algorithm, as discussed above in connection with FIG. 4.

In 506, a sampling rate K may be determined, where K is a rate for sampling an input signal to the device. In some embodiments, determining the sampling rate K may comprise receiving user input. The user input may specify the sampling rate K, or may specify maximum, minimum, or preferred values for K. In other embodiments, the effective rate K may be automatically determined or constrained based on the capabilities of an ADC of the device or other hardware of the device. In other embodiments, K may be determined based on a bandwidth of the input signal. For example, an ADC may require a minimum sampling rate to effectively sample an input signal having a given bandwidth, where the minimum sampling rate may depend upon the type of ADC (e.g., Nyquist ADC or delta-sigma ADC). In some embodiments, the bandwidth may be specified by user input.

In 508, a maximum clock rate R of the programmable hardware element may be determined. In some embodiments, determining the maximum rate R may comprise receiving user input specifying R. In other embodiments, determining the maximum rate R may comprise automatically determining R, e.g., by querying the programmable hardware element or by consulting a list of maximum rates for various types or models of programmable hardware elements.

In 510, a desired clock rate C of the programmable hardware element may be determined. For example, C may be less than or equal to R. In some embodiments, determining the desired clock rate C may comprise receiving user input. For example, a user may wish to clock the programmable hardware element at a rate lower than the maximum clock rate R, e.g., to ease routing constraints. In other embodiments, C may be automatically determined or constrained based on system characteristics or default preferences.

In 512, a number N of the parallel function blocks to be instantiated may be determined. In some embodiments, determining the number of processing portions N may comprise receiving user input specifying N. In other embodiments, N may be automatically determined based on system constraints or other parameters. For example, N may be constrained based on resources available in the programmable hardware element.

In any embodiment, the sampling rate K, the maximum clock rate R, and the number N of the parallel function blocks should be determined such that $K/N \leq R$. Thus, where any two of the parameters K, R, and N are determined by user input or other constraints, the third may be automatically determined or constrained by this relationship. Additionally, where $C<R$, the sampling rate K, the desired clock rate C, and the number N of the parallel function blocks should be determined such that $K/N \leq C$. Thus, where any two of the parameters K, R, and N are determined by user input or other constraints, the third may be automatically determined or constrained by this relationship.

In some embodiments, user input may specify preferred values of K, N, and/or C. Others of these parameters may then be determined automatically by remaining as close as possible to the specified preferred values without violating other system constraints. For example, in one scenario, a user may specify a preferred value of the desired clock rate C that is greater than the maximum clock rate R. In this case, C may be automatically determined to be equal to R. In another embodiment, a user may specify the sampling rate K and a preferred number N of the parallel function blocks, where the specified value of K divided by the preferred value of N is greater than the maximum clock rate R. In this case, N may be automatically determined to be the smallest integer such that $K/N \leq R$.

In some embodiments, a user may be allowed to specify only valid values of the parameters K, N, R, and/or C. For example, where R and K are fixed, a user may be presented with a range of possible values of N that will preserve the relationship $K/N \leq R$, wherein the user may specify a value of N only from the presented range.

In 514, the first signal processing block may be instantiated on the programmable hardware element. This instantiation includes instantiation of the N parallel function blocks and the combiner block. For example, steps 502-512 may have been steps in the process of creating a graphical program comprising the first signal processing block. In 514, the graphical program may be instantiated on the programmable hardware element.

In 516, an ADC of the device may be configured to sample the input signal at the sampling rate K. The ADC may be a time-interleaved ADC, comprising a plurality of parallel ADCs, as known in the art. Thus, the sampling may be performed in an interleaved fashion, on a per sample basis, so as to produce a plurality N of parallel outputs.

In 518, the N parallel outputs of the ADC may be connected to respective inputs of the N parallel function blocks.

Once these steps have been performed, the programmable hardware element may be configured to process the N parallel outputs of the ADC, each of the N parallel function blocks processing a respective one of the N parallel outputs of the ADC. This processing may produce a plurality of intermediate data streams at rate K/N. The programmable hardware element may be further configured to combine the plurality of intermediate data streams using the combiner block to produce output data.

Figure 10:
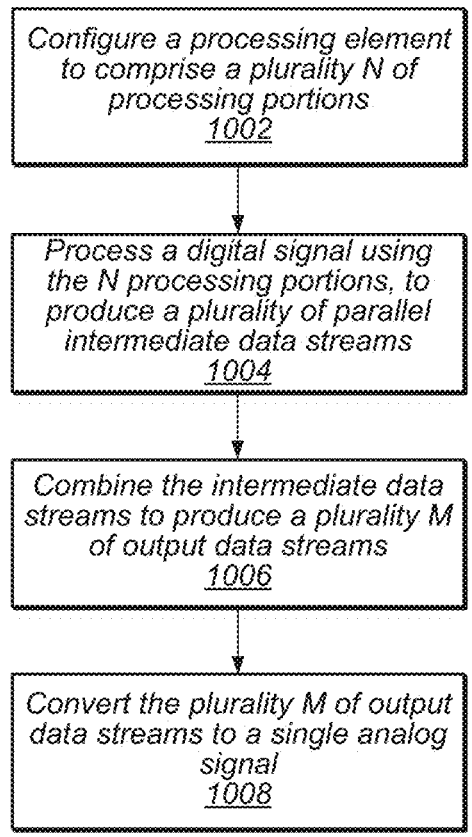
FIG. 10 is a flowchart diagram illustrating an exemplary method for performing parallel processing of a digital signal for output.

FIG. 10—Parallel Processing of a Digital Output Signal

FIG. 10 is a flowchart diagram illustrating a method for performing parallel processing of a digital signal to be output. The method shown in FIG. 10 may be used in conjunction with any of the systems or devices shown in the above Figures, among other devices. In particular, the method may be performed by a device, such as the reconfigurable device 190 illustrated in FIG. 2, comprising a programmable hardware element, such as the programmable hardware element 192 illustrated in FIGS. 2-3. In various embodiments, some of the method elements shown may be performed concurrently, in a different order than shown, or may be omitted. Note also that additional method elements may also be performed as desired. FIG. 9 is a conceptual signal flow diagram of processing and outputting a signal, which may be used in conjunction with the method of FIG. 10. The method may be performed as follows.

As shown, in 1002, a programmable hardware element of a device, such as the programmable hardware element 192 of reconfigurable device 190, may be configured to comprise a plurality N of processing portions, such as the processing portions 908a-n of FIG. 8. For example, the processing portions 908a-n may be configured in the same manner as the processing portions 808a-n discussed above in connection with FIGS. 4 and 8. Specifically, each processing portion of the programmable hardware element may be configured to process data up to a maximum rate R. For example, R may be the maximum clock rate of the programmable hardware element. In some embodiments, the maximum rate R may be provided by user input. In other embodiments, the maximum rate R may be automatically determined, e.g., by querying the programmable hardware element or by consulting a list of maximum rates for various types or models of programmable hardware elements.

In 1004-1006, parallel signal processing may be performed. For example, the parallel processing may be performed in the same manner as in steps 408-410, as discussed above in connection with FIGS. 4 and 8. Specifically, in 1004, each of the N processing portions 908a-n of the programmable hardware element may process a respective one of the N parallel data streams 906a-n. The processing may be performed in parallel by the N processing portions 908a-n. Each of the N processing portions may output one or more intermediate data streams 910a-m. In some embodiments, each processing portion may output an intermediate data stream at a rate O that matches the input rate K/N. In other embodiments, one or more processing portions may each output data at a rate O that is lower than K/N, e.g., if the one or more processing portions perform decimation. In other embodiments, one or more processing portions may each output data at a rate O that is higher than K/N, e.g., if the one or more processing portions perform interpolation. In some embodiments, outputting data at a higher rate than K/N may comprise outputting multiple intermediate data streams, e.g., each having a rate K/N. In any case, each intermediate data stream is produced at a clock rate lower than the maximum clock rate R of the programmable hardware element.

In 1006, the intermediate data streams 910a-m of the N processing portions may be combined to produce output data, such as the data streams 914a-m, which is output by combiner block 912. This combining may comprise additional processing on combinations of the intermediate data streams of the N processing portions, so as to complete the processing function to be performed on the input signal. For example, the intermediate data streams may be cross-multiplied with each other, or other processing may be executed, according to the specific function to be performed on the input signal.

For example, in 1004-1006 the programmable hardware element may perform signal processing on the input signal according to a "divide and conquer" algorithm, as known in the art. According to such algorithms, a process may be divided into a plurality of discrete parallel processes. Each of the discrete parallel processes may provide a solution for a respective portion of the input data. Further processing may then be required, according to the particular algorithm to be performed, to generate the complete solution from a combination of the solutions for the respective portions of the input data. Such algorithms are well known in the art for performing functions such as FFT (Fast Fourier Transform), IFFT (Inverse FFT), FIR (Finite Impulse Response) filter, complex auto- and cross-correlation, digital mixer, frequency domain equalizer, matrix inverter, matrix multiplier, etc.

Such algorithms may be performed according to the present invention in 1004-1006. In 1004, a divided signal may be processed as a plurality of discrete parallel processes by the N processing portions. In 1006, the discrete parallel processes are combined, including further processing to produce output data comprising the complete solution to the function being performed.

The output data may comprise serial signals, parallel multi-bit signals, and/or arrays of multi-bit signals. In some embodiments, the output data may be output as a plurality of data streams, wherein the plurality has the same number of data streams as output by the N processing portions (e.g., N data streams where each of the N processing portions produces one intermediate data stream). For example, FIG. 9 illustrates the output data as M data streams. The data streams of the output data may comprise data configured in an interleaved fashion, on a per sample basis.

In 1008, the output data may be converted to a single analog signal. For example, the data streams 914a-m may be provided to a time-interleaved DAC 916, as known in the art. The DAC 916 may output analog signal 918. Converting output data may comprise interleaving the data streams 914a-m on a per sample basis at a rate of O*M. The rate O*M may be greater than the maximum clock rate R of the programmable hardware element.

The present invention also encompasses configuring a programmable hardware element to perform the method of FIG. 10, in a manner similar to that discussed above in connection with FIG. 5. For example, steps 502-514 may be executed as discussed above. The method may further comprise configuring an interleaved DAC, such as the DAC 916, to convert the output data to a single analog signal. The method may further comprise connecting the output data 914a-m to respective inputs of the DAC 916.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for processing a signal, the method comprising:
   configuring a programmable hardware element of a device to comprise a plurality N of processing portions, wherein the number N of processing portions is based on a processing rate of the programmable hardware element and an effective sampling rate K;

receiving, at the device, an input signal;

sampling, by an analog to digital converter (ADC) of the device, the input signal, wherein said sampling is performed in an interleaved fashion on a per sample basis at the effective sampling rate K and wherein said sampling produces a plurality N of parallel data streams, wherein the effective rate K is greater than the processing rate of the programmable hardware element, wherein each of the N data streams has a rate K/N, wherein the rate K/N is not greater than the processing rate of the programmable hardware element;

each of the N processing portions processing a respective one of the N parallel data streams in parallel, wherein said processing produces a plurality of intermediate data streams; and combining the plurality of intermediate data streams to produce output data.

2. The method of claim 1,
wherein each of the N processing portions produces an intermediate data stream at rate K/N; and
wherein the output data is output at rate K.

3. The method of claim 1,
wherein each of the N processing portions produces an intermediate data stream at output rate O, wherein output rate O is a different rate than K/N; and
wherein the output data is output at rate O*N.

4. The method of claim 1, further comprising
receiving user input indicating the effective sampling rate K;
determining the maximum rate R of the programmable hardware element, wherein the processing rate of the programmable hardware element is the maximum rate R;
determining the number N of the parallel data streams and the number N of the processing portions based on the maximum rate R and the received effective sampling rate K.

5. The method of claim 1, further comprising
determining the effective sampling rate K;
receiving user input indicating a desired clock rate of the programmable hardware element, wherein the processing rate of the programmable hardware element is the received desired clock rate;
determining the number N of the parallel data streams and the number N of the processing portions based on the desired clock rate and the effective sampling rate K, such that the rate K/N is not greater than the desired clock rate.

6. The method of claim 1, wherein the effective rate K is based on a bandwidth of the input signal.

7. A device that processes a signal, the device comprising:
an analog to digital converter (ADC) configured to:
receive in an input signal to the device; and
sample the input signal in an interleaved fashion on a per sample basis at an effective rate K, wherein said sampling produces a plurality N of parallel data streams; and
a programmable hardware element having a maximum clock rate R that is less than K, the programmable hardware element comprising:
a plurality N of processing portions, each of the N processing portions configured to process one of the N parallel data streams at a rate K/N, wherein the N parallel data streams are processed in parallel by the N processing portions; and
a combining portion configured to combine the plurality of intermediate data streams to produce output data;
wherein the number N is determined based on the maximum clock rate R and the effective rate K.

8. The device of claim 7, wherein the effective rate K is based on a bandwidth of the input signal.

9. A method for configuring a device that includes a programmable hardware element, the method comprising:
displaying a plurality of symbols representing signal processing blocks, wherein each of the signal processing blocks is useable to configure the programmable hardware element;
receiving user input selecting a first signal processing block, wherein the first signal processing block specifies a plurality of parallel function blocks and a combiner block;
determine a sampling rate K at which to sample an input signal to be provided to the device;
determining a maximum clock rate R of the programmable hardware element;
determining a number N of the parallel function blocks to instantiate on the programmable hardware element, such that N≥K/R; and
instantiating, on the programmable hardware element, the first signal processing block comprising the N parallel function blocks and the combiner block.

10. The method of claim 9, wherein the device includes an interleaved analog to digital converter (ADC), the method further comprising:
configuring the interleaved ADC to sample the input signal provided to the device in an interleaved fashion on a per sample basis at the sampling rate K, wherein said sampling produces N parallel outputs; and
connecting the N parallel outputs of the ADC to respective inputs of the N parallel function blocks.

11. The method of claim 10, wherein, after said instantiating, the programmable hardware element is configured to:
process the N parallel outputs of the ADC, each of the N parallel function blocks processing a respective one of the N parallel outputs of the ADC, wherein said processing produces a plurality of intermediate data streams at rate K/N; and
combine the plurality of intermediate data streams to produce output data.

12. The method of claim 9, wherein the determining a number N of the parallel function blocks is further based on a number of programmable resources available in the programmable hardware element for instantiating the first signal processing block.

13. The method of claim 9, wherein each of the parallel function blocks comprises an instantiation of a signal processing function, wherein the signal processing function comprises at least one of a finite impulse response (FIR) filter, a FFT (fast Fourier transform), an IFFT (inverse FFT), a complex auto-correlation, a complex cross-correlation, a digital mixer, a matrix inverter, a matrix multiplier, and a frequency domain equalizer.

14. The method of claim 9, wherein the determining the sampling rate K comprises receiving user input specifying the sample rate K.

15. The method of claim 9, wherein the determining the number N of the parallel function blocks comprises receiving user input specifying the number N.

16. The method of claim 9, further comprising
receiving user input indicating a desired clock rate C of the programmable hardware element;

wherein the determining the number N of the parallel function blocks comprises automatically selecting the number N such that $N \geq K/C$.

17. A method for processing a signal by a device comprising a programmable hardware element, the method comprising:

processing a digital signal using a plurality of processing portions of the programmable hardware element, wherein the digital signal comprises a plurality of parallel intermediate data streams, wherein each of the processing portions processes a respective one of the parallel data streams in parallel and outputs a respective intermediate data stream at a clock rate O, wherein the clock rate O is not greater than a maximum clock rate R of the programmable hardware element;

combining the intermediate data streams to produce a plurality M of output data streams, wherein the M output data streams represent a time-interleaved signal;

converting the plurality M of output data streams to a single analog signal, wherein the converting comprises interleaving the M output data streams on a per sample basis at a rate of O*M that is greater than the maximum clock rate R of the programmable hardware element.

18. The method of claim 1, wherein the processing rate of the programmable hardware element is a maximum rate R at which each of the processing portions is able to process data.

19. The method of claim 1, further comprising:

configuring the N processing portions to operate at a clock rate C that is less than a maximum clock rate of the programmable hardware element, wherein the processing rate of the programmable hardware element is the clock rate C.

* * * * *